Feb. 14, 1967 W. M. SILLERS, JR 3,304,440

PULSE SHAPING CIRCUIT

Filed Dec. 26, 1963

INVENTOR
W. M. SILLERS. JR.
BY R. B. Ardis
ATTORNEY

United States Patent Office 3,304,440

Patented Feb. 14, 1967

3,304,440

PULSE SHAPING CIRCUIT

William M. Sillers, Jr., Mendham, N.J., assignor to Bell Telephone Laboratories, Incorporated, New York, N.Y., a corporation of New York Filed Dec. 26, 1963, Ser. No. 333,597
5 Claims. (Cl. 307—88.5)

This invention relates to narrow width pulse shaping circuits and more particularly to narrow width pulse shaping circuits for phase controlled power supplies.

Pulse stimulated circuitry often requires pulse generating circuits which are capable of delivering narrow width, high amplitude pulses with a fast rise and decay time. The pulse shaping circuits employed in the pulse generating circuits to obtain the required narrow width pulses are often relatively complex, hence expensive and unreliable.

One such pulse stimulated circuit is the semiconductor controlled rectifier circuit wherein it is desired to sharply and quickly apply a pulse to the gate electrode of the controlled rectifier to quickly initiate conduction therethrough at a predetermined point in time. Since the controlled rectifier is often switched at a high frequency in applications wherein the time precision and reliability switching requirements are exacting, high amplitude, narrow width firing pulses are required. The pulses must additionally be either amplitude or width controlled so that the power dissipation rating of the controlled rectifier gate-cathode junction is not exceeded.

The controlled rectifier pulse generating and shaping circuits of the prior art have employed either unijunction transistor or blocking oscillator circuits, both of which are controlled in accordance with load voltage variations, to provide time (phase) positioned firing pulses to the controlled rectifier. Unijunction transistor circuits are relatively expensive and, due to the present limited commercial availability of unijunction transistors, generally not feasible in circuits that are to be produced in large quantities. Although the components for the blocking oscillator firing circuits are readily available, such circuits require a large number of components, including an oscillator transformer, and hence are comparatively expensive.

It is, therefore, the object of this invention to provide an inexpensive pulse shaping circuit capable of producing controllable narrow width, high amplitude pulses with fast rise and decay times which are readily adaptable to pulse stimulated circuitry such as semiconductor controlled rectifier circuits.

The present invention employs two semiconductor devices, which may be diodes or transistors, interconnected so that the forward saturating current flow in the first device is blocked by the second device. Since the first device is in saturation, the cloud of charge carriers at the semiconductor junction will permit a current pulse which is passed through the second device in the forward conductivity direction to pass through the first device in the reverse conductivity direction until the excess charge carriers in the first device are swept into their respective semiconductor regions. An easily controllable pulse of narrow width and high amplitude with a rapid rise and decay time may thereby be supplied to a utilization circuit connected to the first device. Due to the simplicity and very low cost of this pulse shaping circuit, it is readily adaptable to all pulse stimulated circuitry and, as discussed in detail hereinafter, notably to load voltage variation controlled regulator circuits.

Other objects and features of the present invention will become apparent upon consideration of the following detailed description when taken in conjunction with the accompanying drawing in which.

Figure 1:
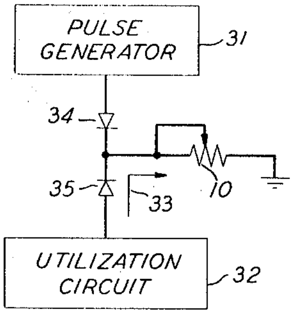
FIG. 1 is a simplified pulse shaper embodying the invention.

In the pulse shaper illustrated in FIG. 1, a current indicated by the arrow 33, sufficient to saturate the semiconductor diode 35 in the forward conductivity direction, may be supplied either by the utilization circuit 32, as shown, or by external circuitry. Variable resistor 10 controls the magnitude of the forward current flow and hence the degree of saturation of diode 35 and, as discussed hereinafter, thereby controls the width of the pulse that is delivered to the utilization circuit 32. Diode 34 is nonconductive until a positive current pulse is applied by pulse generator 31 and hence blocks the saturation current flow through diode 35, the latter current all flowing through resistor 10. Since diode 35 is in saturation, the cloud of charge carriers at the semiconductor junction will permit a positive current pulse from pulse generator 31, which is passed through diode 34 in the forward conductivity direction, to pass through diode 35 in the reverse conductivity direction for the period of time required to sweep the excess charge carriers at the semiconductor junction back to their respective semiconductor regions. Since the charge carriers are swept back in a relatively short interval of time and the reverse conduction through diode 35 then terminates quickly, the pulse of current initiated by pulse generator 31 appears at the utilization circuit 32 as a narrow width, high amplitude pulse with a sharp rise and decay time. It has been found experimentally that the width or duration of the pulse delivered to the utilization circuit may be easily controlled by varying the degree of saturation of diode 35 simply by adjusting the variable resistor 10. Pulse shaping is thus accomplished simply, inexpensively, and with a minimum number of components.

Figure 2:
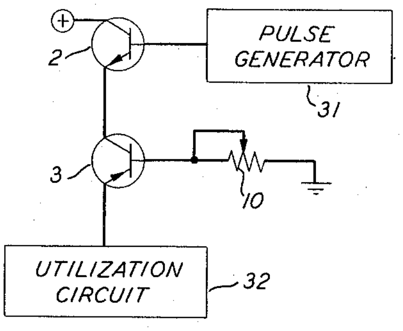
FIG. 2 is an alternate pulse shaper embodying the invention.

FIG. 2 illustrates an alternate embodiment of the invention wherein transistors are used in place of the diodes. The saturation current, which again may be supplied either from external circuitry or the utilization circuit 32, flows through both the emitter-base path of transistor 3 and the adjustable resistor 10. Transistor 2 is nonconductive until a positive pulse is applied to its base electrode by pulse generator 31 and hence blocks any emitter-collector saturation current flow from transistor 3, all the saturation current passing through both the emitter-base path of transistor 3 and adjustable resistor 10. Since the base-emitter path of transistor 3 is in saturation, the cloud of excess charge carriers at this junction and in the base region will permit a current pulse which is the sum of base-emitter and collector-emitter currents of transistor 2, which were in turn initiated by a pulse from pulse generator 31, to pass through the inverse collector-emitter path of transistor 3 for the period of time required to sweep the excess charge carriers in the base region and at the base-emitter junction of transistor 3 back into their respective semiconductor regions. Transistor 2 may, if desired, provide current amplification of the pulse applied to its base electrode. Adjustable resistor 10 again provides an arrangement for readily controlling the degree of saturation of transistor 3, thereby controlling the width of the pulse applied to the utilization circuit 32.

Figure 3:
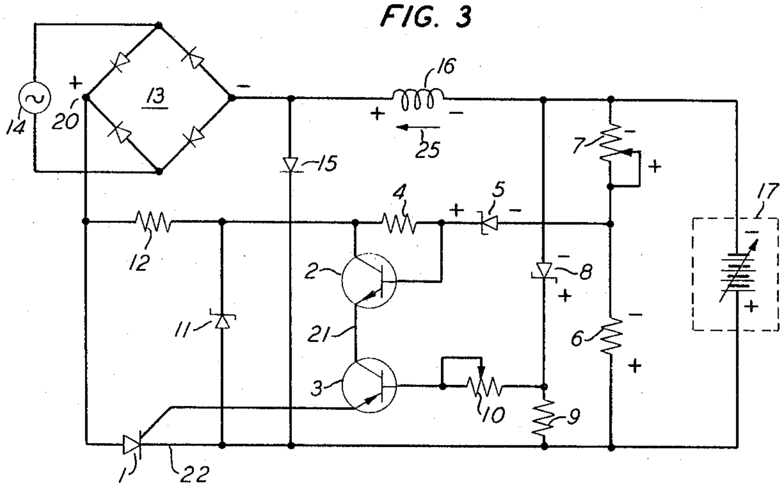
FIG. 3 is an embodiment of the invention in the form of a semiconductor controlled rectifier regulator using the pulse shaper shown in FIG. 2.

FIG. 3 illustrates a pulse stimulated circuit embodying the invention in which the low cost pulse shaping circuit of FIG. 2 is employed. As discussed heretofore, a high amplitude, narrow width, and power controlled pulse is required to trigger a silicon controlled rectifier to insure that the device will fire at a precise point in time when switched at high frequencies while additionally taking care not to exceed the maximum power rating of the gate-cathode junction of the controlled rectifier. The present invention possesses the desired features and due to its simplicity is uniquely adaptable to such pulse stimulated circuits as will be readily seen from the following discussion of the circuit of FIG. 3.

In the circuit of FIG. 3 an input alternating-current source 14 is connected to the input terminals of a full-wave diode bridge rectifier 13. The anode-cathode path of a controlled rectifier 1 is serially connected from the positive terminal of the diode bridge to the positive terminal of the load, or battery to be charged, 17. The negative terminal of the load 17 is, in turn, serially connected with filter inductor 16 to the negative terminal of bridge rectifier 13. Resistors 6 and 7 are serially connected across the load 17 as is resistor 9 and continuously conducting (in the zener direction) zener diode 8. Resistor 12, resistor 4, and continuously conducting (also in the zener direction) zener diode 5 are serially connected from the positive terminal of the bridge rectifier 13 to the juncture of resistors 6 and 7. Flyback diode 15 is serially connected in the forward conductivity direction from the negative terminal of bridge rectifier 13 to the positive terminal of the load 17. The collector and base electrodes of transistor 2 are connected across resistor 4, while the emitter electrode of transistor 2 is connected to the collector electrode of transistor 3. The emitter electrode of transistor 3 is connected to the gate electrode of controlled rectifier 1. The base of transistor 3 is connected through adjustable resistor 10 to the juncture of zener diode 8 and resistor 9. Zener diode 11 is connected to the zener or inverse direction from the juncture of resistors 12 and 4 to the cathode electrode of controlled rectifier 1.

Figure 4:
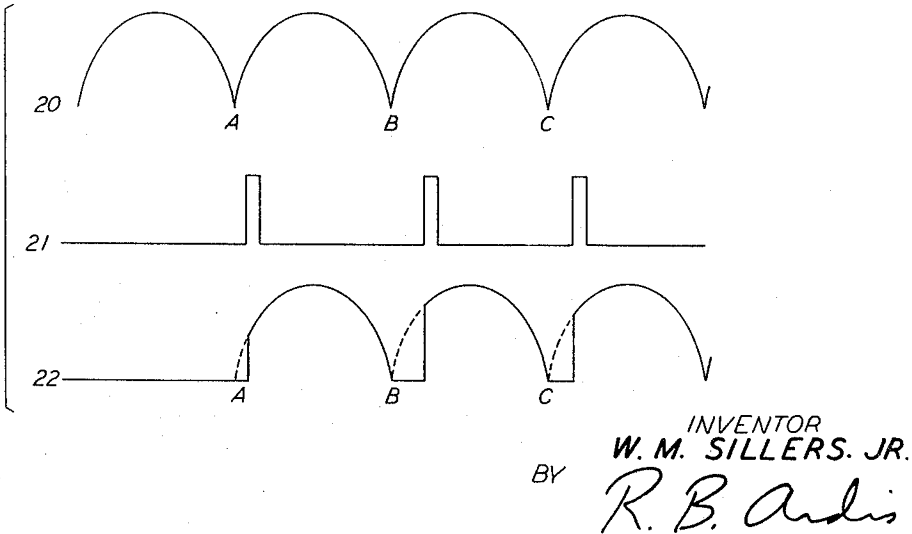
FIG. 4 illustrates waveforms at various points in the circuit of FIG. 3.

The operation of the circuit is most easily understood if it is assumed that after several starting cycles of operation, the potential at the positive terminal of bridge rectifiers 13 is at the null or zero point as indicated by point A on waveform 20 of FIG. 4. At the point on the input waveform there is a minimal forward sustaining current flow through the anode-cathode path of controlled rectifier 1 which, as discussed hereinafter, in combination with the potential applied from inductor 16 via flyback diode 15, renders controlled rectifier 1 nonconductive and thus terminates the current flow through the load 17 and filter inductor 16. The energy stored in filter inductor 16 is such, however, as to inherently attempt to sustain the current flow therethrough in the same direction (as indicated by the arrow 25) as when controlled rectifier 1 was conducting. In order to sustain the current flow in the same direction the stored energy induces a potential of a polarity opposite to the potential across the filter inductor when controlled rectifier 1 was conducting, the polarity of the induced potential being as indicated on the drawing. This induced potential biases flyback diode 15 into conduction and provides a current path for the energy stored in inductor 16 to the load 17 during the nonconductive interval of controlled rectifier 1. Energy is thus continuously supplied to the battery or load 17 with only small variations in the load voltage. The potential induced in inductor 16 is also applied via flyback diode 15 to back bias controlled rectifier 1 which, in combination with the low forward sustaining anode-cathode current flow, terminates conduction through controlled rectifier 1.

Zener diode 5 which is normally rendered conductive in the zener or reverse direction by the potential applied from the positive terminal of the bridge 13 through resistors 12, 4, and 7, filter inductor 16, and back to the negative terminal of bridge 13, is maintained continuously conductive by the potential induced in filter inductor 16 during the interval that the input waveform 20 falls to zero. This latter path can be traced from the positive terminal of the inductor 16 through the bridge 13 which, at zero input potential is essentially a short circuit, through resistors 12, 4 and 7, and back to the negative terminal of the inductor 16.

Zener diode 8 will also be rendered continuously conductive in the reverse or zener direction by the potential of the load 17 except in the case where the load or battery potential falls below the zener potential. Since, as will be apparent from the following discussion, the present circuit will be rendered inoperative if the load 17 potential falls below the zener potential of the diode 8, undervoltage protection is simply and inexpensively provided as an integral part of the overall circuit.

As noted heretofore, controlled rectifier 1 is nonconductive at point A on waveform 20 due to both the lack of forward sustaining current and the back bias of the induced potential in inductor 16 which is applied via flyback diode 15. As the input potential rises from zero or from point A on waveform 20, however, an anode-gate leakage current in controlled rectifier 1 flows from the positive terminal of the bridge 13, through the anode-gate path of controlled rectifier 1, through the emitter-base path of transistor 3, through adjustable resistor 10, through continuously conducting zener diode 8, and back to the negative terminal of the bridge 13. This leakage current is sufficient to saturate the emitter-base junction of transistor 3. Transistor 3 is thus saturated during the nonconductive interval of controlled rectifier 1 and, as discussed hereinafter, is biased out of saturation into cut off when controlled rectifier 1 is biased into conduction.

As the input voltage across the positive and negative terminals of bridge rectifier 13 rises from the zero point A on waveform 20, the potentials across the voltage responsive components in the loop comprising resistors 12, 4, and 7, continuously conductive zener diode 5, and filter inductor 16, which are all connected in a serial loop across the positive and negative terminals of bridge rectifier 13, also rise. Since the voltage across the load 17 is relatively constant, the sum of the voltages across resistors 6 and 7 is constrained to the load voltage. It follows, therefore, that as the potential across resistor 7 proportionally rises with the increase in the input voltage appearing across the positive and negative terminals of bridge rectifier 13, the voltage across resistor 6 must decrease in a direct proportion to the voltage increase across resistor 7, with the sum of the voltages across these resistors remaining equal to the load voltage. When the voltage across resistor 6 decreases to a magnitude less than the magnitude of the potential appearing across zener diode 5, the potential at the base of transistor 2 is positive with respect to the positive terminal of resistor 6 and a current flow is initiated through the base-emitter path of transistor 2. This current flow may be traced from the positive terminal of zener diode 5, through the base-emitter path of transistor 2, through the collector-emitter path of saturated transistor 3 in a direction inverse to that of the normal emitter-collector current flow, through the p–n gate-cathode junction (essentially a diode) of controlled rectifier 1, through resistor 6, and back to the negative terminal of zener diode 5. Once the base-emitter path of transistor 2 is biased into conduction, a current flow is also instantly initiated from the positive terminal of rectifier 13, through resistor 12, through the collector-emitter path of transistor 2, through the inverse collector-emitter path of saturated transistor 3, through the gate-cathode path of controlled rectifier 1, through resistor 9, through continuously conducting zener diode 8, through filter inductor 16, and back to the negative terminal of rectifier 13. The sharp, and relatively large, current flow or surge in the gate-cathode path of controlled rectifier 1 initiates conduction through controlled rectifier 1 which then continues to conduct until a point approximating the null or zero point B on waveform 20 is reached at which time conduction is terminated, as discussed heretofore.

Firing pulse width control is inherently achieved by the firing circuit. This is easily understood once the discussion of the inverse collector-emitter conduction through saturated transistor 3 is recalled. As noted heretofore, the emitter-base path of transistor 3 is saturated before the conduction of controlled rectifier 1 by the anode-gate leakage current through controlled rectifier 1. Since the emitter-base junction of transistor 3 is saturated, there is a cloud of excess charge carriers at this junction which extends into the base region so that the emitter-base, emitter-collector and collector-base paths of the transistor all have a negligible voltage drop thereacross, i.e., are essentially short circuits. The pulse of current from both the base-emitter and collector-emitter paths of transistor 2 will flow through the inverse collector-emitter path of transistor 3 until the charge carriers are reformed into their respective semiconductor regions by the inverse current and transistor 3 becomes a transistor at cut off. This occurs rather rapidly and the current flow through the collector-emitter paths of transistors 2 and 3 is sharply terminated. Thus, a narrow width pulse with a rapid rise and decay time is transmitted through the gate-cathode path of controlled rectifier 1 to initiate conduction therein. The pulses appearing at the emitter and collector electrodes of transistors 2 and 3, respectively, are shown as waveform 21. It has been found experimentally that the width of the firing pulse may be controlled by varying the resistance of adjustable resistor 10 and thus controlling the degree of saturation of transistor 3. Once transistor 3 ceases to conduct in the inverse direction, transistor 2 is cut off and is thus quickly and readily made available for the next input half cycle.

Regulation is inherently provided in the circuit of FIG. 3 since the point in time at which the voltage of zener diode 5 exceeds the potential across resistor 6 to start the sequence which initiates a firing pulse for controlled rectifier 1 is directly dependent to the magnitude of the load 17 potential which appears across resistors 6 and 7. If the load 17 potential should fall below the desired level, the potential appearing across resistors 6 and 7 is reduced and the potential across zener diode 5 will exceed the potential of resistor 6 earlier in the input half cycle thus causing controlled rectifier 1 to be triggered into conduction earlier in the input half cycle to thereby compensate for the decrease or fall in load voltage. Such a condition is illustrated by waveform A–B of waveforms 20 with the resultant A–B waveform appearing at the cathode electrode of controlled rectifier 1 shown as waveform 22. If the output voltage should rise above the desired level, then the voltage across resistors 6 and 7 will also rise and the voltage of zener diode 5 will exceed that of resistor 6 relatively later in the input half cycle, thereby causing controlled rectifier 1 to fire relatively later in the input half cycle to decrease the amount of load current flow to the load in the half cycle and thus compensate for the increase in load 17 voltage. This latter condition is illustrated by waveform B–C of waveforms 20 and 22.

Zener diode 11, in combination with current limiting resistor 12, limits the inverse voltage appearing across transistors 2 and 3 and may be eliminated in applications where there is no danger that the inverse voltage rating of the transistors will be exceeded.

The above described arrangement is illustrative of the application of the principles of the invention. Other embodiments may be devised by those skilled in the art without departing from the spirit and scope of the invention.

What is claimed is:

1. A pulse shaping circuit comprising first and second transistors each having base, collector, and emitter electrodes, pulse generating means connected to the base electrode of said first transistor to render said first transistor conductive at predetermined intervals, circuit means connecting the base and emitter electrodes of said second transistor to provide a current sufficient to saturate the base-emitter junction of said second transistor, and means serially connecting the emitter-collector paths of said first and second transistors between a source of potential and a pulse stimulated utilization circuit so that a pulse applied to the base electrode of said first transistor causes a current to flow in the emitter-collector path of said first transistor in the forward conductivity direction, and in the emitter-collector path of said second transistor in the inverse conductivity direction, until said second transistor is driven from a saturated condition into cut-off and the inverse current flow is terminated, whereby a narrow width pulse is transmitted to said pulse stimulated utilization circuit.

2. A pulse shaping circuit in accordance with claim 1 wherein said circuit means includes a variable impedance to control the degree of saturation of said second transistor, whereby the interval of inverse conduction through said first transistor may be controlled.

3. A regulator circuit comprising first and second transistors, each having base, collector, and emitter electrodes, a source of pulsating input potential, a load, a bistable device having a high and a low state of conduction, means serially connecting said bistable device between said source of input potential and said load, means serially connecting the emitter-base path of said first transistor with said bistable device and said source to provide a saturation current in the emitter-base path of said first transistor, a source of reference potential, means serially connecting said source of reference potential between the base electrode of said second transistor and said load to compare the load voltage and input voltage pulsations with the reference potential, and means serially connecting the collector-emitter paths of said first and second transistors between said source of input potential and said bistable device so that conduction is initiated through the emitter-collector path of said second transistor in the forward conductivity direction when the reference voltage exceeds the difference between the load and input pulsation voltages, and conduction is also initiated through the emitter-collector path of said first transistor in an inverse conductivity direction, until said first transistor is driven from a saturated condition into cut-off to terminate the inverse current flow, whereby a narrow width pulse is transmitted to said bistable device to initiate the high state of conduction in said bistable device in accordance with load voltage variations.

4. A regulator circuit comprising first and second transistors each having base, collector, and emitter electrodes, an input source of pulsating direct current, a load, a semiconductor controlled rectifier having anode, cathode, and gate electrodes, means serially connecting the anode-cathode electrodes of said controlled rectifier between said input source and said load, first and second resistors, means serially connecting said first and second resistors across said load, a zener diode, means serially connecting said zener diode between said source and the junctor of said first and second resistors so that said zener diode is continuously conducting in the zener direction from said source to said junctor, means connecting the base electrode of said first transistor to the source terminal of said zener diode, means connecting the emitter-base path of said second transistor between the gate electrode of said controlled rectifier and said source to provide a saturation current in the emitter-base path of said second transistor from said source through the anode-gate path of said controlled rectifier, and means serially connecting the emitter-collector paths of said first and second transistors between said source of input potential and the gate electrode of said controlled rectifier so that conduction is initiated both through the emitter-collector path of said first transistor in the forward conductivity direction when the voltage across said zener diode exceeds the potential across said first resistor and also through the emitter-collector path of said second transistor in an inverse conductivity direction until said second transistor is driven from a saturated condition into cut-off and the inverse current flow is terminated, whereby a narrow width firing pulse is transmitted to the gate electrode of said controlled rectifier to initiate conduction in the anode-cathode path of said controlled rectifier.

5. A regulating circuit in accordance with claim 4 wherein adjustable resistive means is serially connected in the emitter-base path of said second transistor to control the degree of saturation of the emitter-base path of said second transistor and thereby control the duration of the pulse applied to the gate electrode of said controlled rectifier.

References Cited by the Examiner

UNITED STATES PATENTS 2,825,820 4/1958 Sims -------------- 307—88.5

ARTHUR GAUSS, *Primary Examiner.*

J. BUSCH, *Assistant Examiner.*